(12) United States Patent (10) Patent No.: US 12,660,129 B2
Hayafune (45) Date of Patent: Jun. 16, 2026

(54) HEAT SINK

(71) Applicants: NEC Corporation, Minato-ku (JP);
NEC Platforms, Ltd., Kawasaki (JP)

(72) Inventor: Tomohiro Hayafune, Kanagawa (JP)

(73) Assignee: NEC CORPORATION, Tokyo (JP)

( * ) Notice: Subject to any disclaimer, the term of this
patent is extended or adjusted under 35
U.S.C. 154(b) by 109 days.

(21) Appl. No.: 18/685,277

(22) PCT Filed: Aug. 26, 2022

(86) PCT No.: PCT/JP2022/032295
§ 371 (c)(1),
(2) Date: Feb. 21, 2024

(87) PCT Pub. No.: WO2023/037912
PCT Pub. Date: Mar. 16, 2023

(65) Prior Publication Data
US 2024/0357768 A1 Oct. 24, 2024

(30) Foreign Application Priority Data
Sep. 8, 2021 (JP) ................................. 2021-146390

(51) Int. Cl.
*H05K 7/20* (2006.01)
(52) U.S. Cl.
CPC .................................. *H05K 7/2039* (2013.01)
(58) Field of Classification Search
CPC .......................... H05K 7/2039; H05K 7/20409
USPC ......................................................... 165/80.3
See application file for complete search history.

(56) References Cited

U.S. PATENT DOCUMENTS

| | | | | |
|---|---|---|---|---|
| 6,371,200 B1 * | 4/2002 | Eaton | ...................... | C06B 47/00 |
| | | | | 165/185 |
| 7,545,647 B2 * | 6/2009 | Karidis | ................. | H01L 23/427 |
| | | | | 257/713 |
| 8,291,965 B2 * | 10/2012 | Wayman | ............... | H01L 23/467 |
| | | | | 165/185 |

(Continued)

FOREIGN PATENT DOCUMENTS

| | | | |
|---|---|---|---|
| CN | 207652866 U | * | 7/2018 |
| CN | 209710561 U | * | 11/2019 |

(Continued)

OTHER PUBLICATIONS

International Search Report for PCT Application No. PCT/JP2022/
032295, mailed on Nov. 8, 2022.

*Primary Examiner* — Terrell L McKinnon
(74) *Attorney, Agent, or Firm* — Sughrue Mion, PLLC

(57) ABSTRACT

To provide a heat sink with improved heat dissipation
efficiency and high manufacturability. The heat sink (100)
according to the present disclosure includes a base (1)
having a surface on which a plurality of heat-dissipating fins
(2) are provided at intervals. Each of the plurality of
heat-dissipating fins (2) includes: a first oblique fin part (21)
inclined to one side of the surface at a first angle θ1 with
respect to a reference line AX extending in a longitudinal
direction of the surface; a second oblique fin part (22)
inclined to other side of the surface at a second angle θ2 with
respect to the reference line AX; and a fin linkage part (23)
for linking an end of the first oblique fin part (21) to an end
of the second oblique fin part (22), which are opposed to
each other.

9 Claims, 11 Drawing Sheets

(56)          References Cited

U.S. PATENT DOCUMENTS

| | | | | |
|---|---|---|---|---|
| 9,161,478 | B2 * | 10/2015 | Pierides | H05K 7/20409 |
| D1,010,601 | S * | 1/2024 | Hayafune | D14/155 |
| D1,010,602 | S * | 1/2024 | Hayafune | D14/155 |
| 12,114,467 | B2 * | 10/2024 | Kallmark | H01L 23/467 |
| 12,222,173 | B2 * | 2/2025 | Rubalewski | F28F 3/022 |
| 2003/0136545 | A1 * | 7/2003 | Lin | F28F 3/06 |
| | | | | 257/E23.099 |
| 2007/0053168 | A1 * | 3/2007 | Sayir | H01L 23/367 |
| | | | | 257/E23.105 |
| 2007/0215336 | A1 * | 9/2007 | Hsu | H01L 23/467 |
| | | | | 257/722 |
| 2013/0223012 | A1 * | 8/2013 | Pierides | H05K 7/20409 |
| | | | | 165/185 |
| 2020/0015384 | A1 | 1/2020 | Tivadar | |
| 2021/0051815 | A1 * | 2/2021 | Van Wyk | H01L 23/467 |
| 2022/0361372 | A1 * | 11/2022 | Kallmark | H01L 23/3672 |
| 2023/0096962 | A1 * | 3/2023 | Udell | H03F 3/245 |
| | | | | 455/90.2 |
| 2025/0220859 | A1 * | 7/2025 | van Wyk | H05K 7/2039 |
| 2025/0334344 | A1 * | 10/2025 | Kim | H05K 7/20336 |

FOREIGN PATENT DOCUMENTS

| | | | | |
|---|---|---|---|---|
| CN | 111256505 | A | 6/2020 | |
| CN | 111698893 | A | 9/2020 | |
| JP | 3192330 | U | 8/2014 | |
| JP | 2017-098274 | A | 6/2017 | |
| KR | 2686770 | B1 * | 7/2024 | H05K 7/20409 |

* cited by examiner

HEAT SINK

This application is a National Stage Entry of PCT/JP2022/032295 filed on Aug. 26, 2022, which claims priority from JP Patent Application 2021-146390 filed on Sep. 8, 2021, the contents of all of which are incorporated herein by reference, in their entirety.

TECHNICAL FIELD

The present disclosure relates to a heat sink.

BACKGROUND ART

Patent Literature 1 discloses a heat sink capable of improving heat dissipation efficiency. Specifically, Patent Literature 1 discloses a heat sink including a base plate having a board-like shape extending vertically upward from a substrate and a plurality of heat-dissipating fins arranged in parallel at predetermined intervals on both surfaces of the base plate. The plurality of heat-dissipating fins are arranged in a plurality of rows along the vertical direction on the surface of the base plates and each fin is inclined in the vertical direction (see, in particular, FIG. 4(a)). Here, a space extending in the vertical direction is provided between the heat-dissipating fins constituting the left-side column and the heat-dissipating fins constituting the right-side column.

CITATION LIST

Patent Literature

Patent Literature 1: Japanese Utility Model Registration No. 3192330

SUMMARY OF INVENTION

Technical Problem

However, in the case of manufacturing a heat sink having a vertically extending space between the heat-dissipating fins constituting the left-side column and the heat-dissipating fins constituting the right-side column as in Patent Literature 1, there is a problem that the manufacturability of the heat sink becomes low. For example, in the case of manufacturing a heat sink having a vertically extending space between the heat-dissipating fins constituting the left-side column and the heat-dissipating fins constituting the right-side column by casting as in Patent Literature 1, the manufacturability of the heat sink becomes low because the running process (in particular, the running process for each of the heat-dissipating fins constituting the left-side column and the heat-dissipating fins constituting the right-side column) becomes poor.

The present disclosure has been made in view of the problem mentioned above and an object of the present disclosure is to provide a heat sink with improved heat dissipation efficiency and high manufacturability.

Solution to Problem

A heat sink according to the present disclosure includes a base having a surface on which a plurality of heat-dissipating fins are provided at intervals, in which each of the plurality of heat-dissipating fins includes:

a first oblique fin part inclined to one side of the surface at a first angle with respect to a reference line extending in a longitudinal direction of the surface;

a second oblique fin part inclined to other side of the surface at a second angle with respect to the reference line; and a fin linkage part for linking an end of the first oblique fin to an end of the second oblique fin part, which are opposed to each other.

Advantageous Effects of Invention

According to the present disclosure, a heat sink with an improved heat dissipation efficiency and high manufacturability can be provided.

EXAMPLE EMBODIMENT

Hereinafter, a specific example embodiment in which the present disclosure is applied will be described in detail with reference to the drawings. In each drawing, the same elements are assigned the same reference symbols, and duplicate descriptions thereof will be omitted as necessary for clarity of the description.

First Example Embodiment

Figure 1:
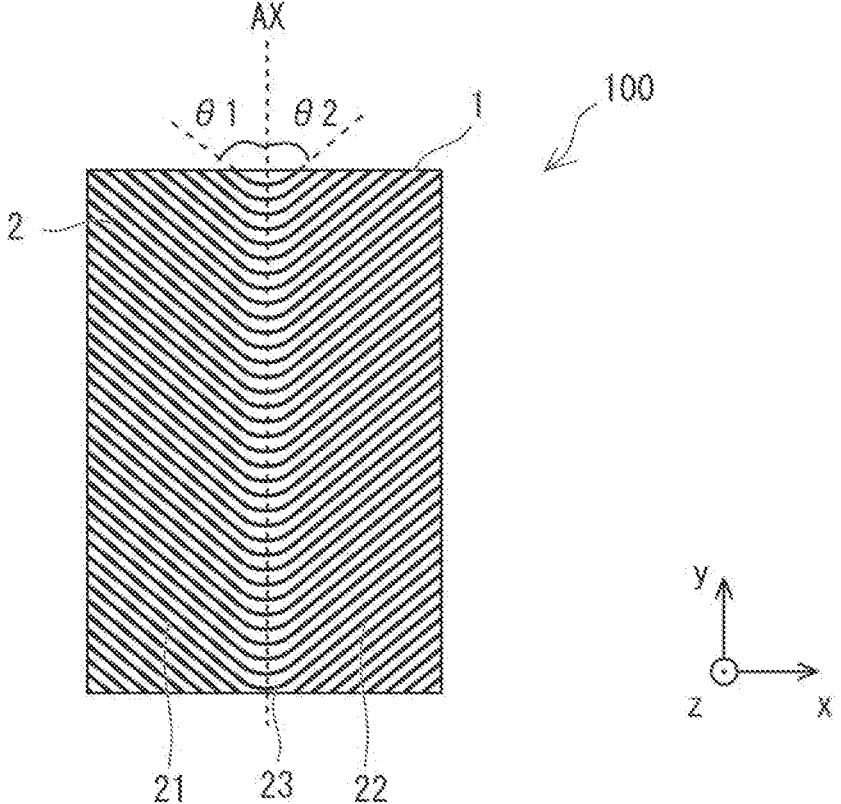
FIG. 1 is a front view showing an example of a configuration of a heat sink according to a first example embodiment.

Referring to FIG. 1, a configuration of a heat sink 100 according to the first example embodiment will be described. FIG. 1 is a front view showing an example of a configuration of the heat sink 100. Needless to say, the right-handed xyz orthogonal coordinates shown in FIG. 1 and the like are shown for the sake of convenience of explaining the positional relationship of the structural components. Normally, the xy-plane represents a surface of a base 1 to be described later, and the z-axis positive direction represents the height direction of a heat-dissipating fin 2 to be described later, which is the same in all the drawings.

The heat sink 100 includes the base 1 having a surface on which a plurality of the heat-dissipating fins 2 are provided at intervals. Each of the plurality of heat-dissipating fins 2 includes: a first oblique fin part 21 inclined to one side of the surface at a first angle $\theta1$ with respect to a reference line AX extending in a longitudinal direction (y-direction) of the surface; a second oblique fin part 22 inclined to other side of the surface at a second angle $\theta2$ with respect to the reference line AX; and a fin linkage part 23 for linking an end of the first oblique fin part 21 to an end of the second oblique fin part 22, which are opposed to each other.

Accordingly, in the heat sink 100 according to the first example embodiment, heat dissipation efficiency can be improved, and the running process at the time of casting the heat sink 100 can be improved and the manufacturability can be improved more than in the case where the fin linkage part 23 is not provided.

Second Example Embodiment

Figure 2:
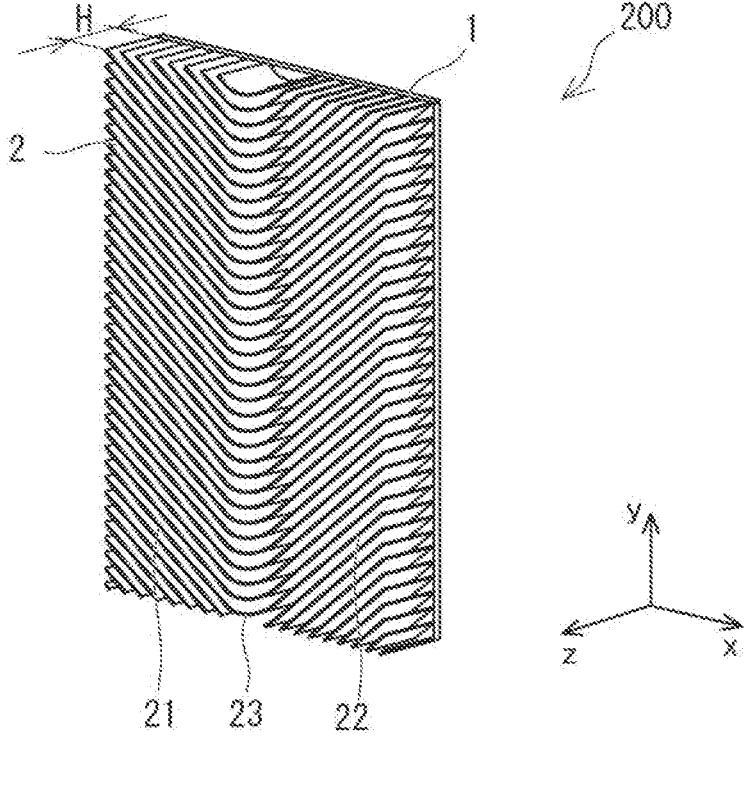
FIG. 2 is a side view showing an example of a configuration of a heat sink according to a second example embodiment.
Figure 3:
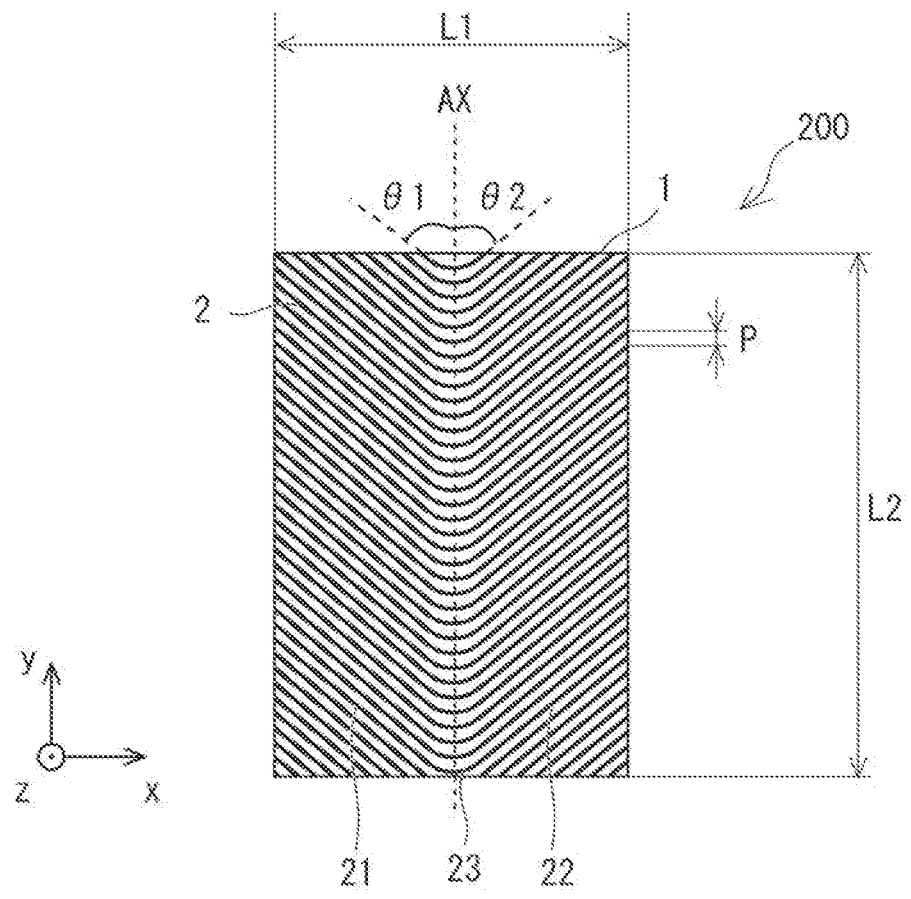
FIG. 3 is a front view showing an example of a configuration of the heat sink according to the second example embodiment.

First, the configuration of a heat sink 200 according to a second example embodiment will be described with reference to FIGS. 2 and 3. The heat sink 200 is a specific example of the heat sink 100 according to the first example embodiment. FIG. 2 is a perspective view showing an example of a configuration of the heat sink 200. FIG. 3 is a front view showing an example of a configuration of the heat sink 200.

As shown in FIGS. 2 and 3, the heat sink 200 includes base 1 having a board-like shape and including one surface and other surface on the opposite side of the one surface and having a thickness in the z-direction, and the plurality of heat-dissipating fins 2 provided at intervals on the one surface. The heat sink 200 (the base 1 and the heat-dissipating fin 2) is an integrated body manufactured by, for example, casting a metal material such as aluminum. The heat sink 200 (the base 1 and the heat-dissipating fin 2) may be manufactured by skiving aluminum or a copper-based metal material. The heat sink 200 may be manufactured by press-fitting the base 1 and the heat-dissipating fins 2 manufactured separately. The metal material used for casting/skiving/press-fitting is not limited to the above-mentioned metal material.

The plurality of heat-dissipating fins 2 each includes a left oblique fin part (an example of the first oblique fin part of the present disclosure) 21, a right oblique fin part (an example of the second oblique fin part of the present disclosure) 22, and a fin linkage part 23, respectively.

The left oblique fin part 21 is provided on the one surface of the base 1 in a state of being inclined to the left side of the one surface at a first angle $\theta1$ with respect to a reference line AX extending in a longitudinal direction (y-direction). The reference line AX passes through the center of the base 1 with respect to the lateral direction (x-direction) and extends in the longitudinal direction (y-direction). Here, the plurality of left oblique fin parts 21 are arranged in the longitudinal direction at predetermined intervals (pitch P; see, FIG. 3) from each other. The left oblique fin parts 21 extend linearly along the one surface (xy-plane).

The right oblique fin part 22 is provided on the one surface of the base 1 in a state of being inclined to the right side of the one surface at a second angle $\theta2$ with respect to the reference line AX extending in a longitudinal direction (y-direction). Here, the plurality of right oblique fin parts 22 are arranged in the longitudinal direction at predetermined intervals (pitch P; see, FIG. 3) from each other. The right oblique fin parts 22 extend linearly along the one surface (xy-plane).

The first angle $\theta1$ and the second angle $\theta$ are each preferably an acute angle. The first angle $\theta1$ and the second angle $\theta$ may instead each be an obtuse angle. Further, the first angle $\theta1$ is preferably the same angle as the second angle $\theta$. That is, the left oblique fin parts 21 and the right oblique fin parts 22 are preferably arranged in linear symmetry (bilateral symmetry) with respect to the reference line AX. In this way, the temperature of the base 1 can be lowered uniformly regardless of the direction from which the natural wind is supplied to the heat-dissipating fins 2. The left oblique fin parts 21 and the right oblique fin parts 22 may be arranged asymmetrically with respect to the reference line AX. For example, the reference line AX may be a line that passes a position deviated from the center of the base 1 with respect to the lateral direction (x-direction) and extends in the longitudinal direction (y-direction). Further, the reference line AX may not be limited to a straight line extending in a longitudinal direction, and instead may be a curve (e.g., an S-curve) extending in a longitudinal direction or the like. Further, the angle $\theta1$ and the angle $\theta2$ may differ from each other.

The fin linkage part 23 links (connects) an end of the left oblique fin part 21 to an end of the right oblique fin part 22, which are opposed to each other. The fin linkage part 23 projects curvedly downward in a longitudinal direction. Note that the direction in which the fin linkage part 23 curves is not limited to a downward longitudinal direction. For example, when both the first angle $\theta1$ and the second angle $\theta$ are obtuse angles, the fin linkage part 23 may project curvedly upward in a longitudinal direction. The lowest part of the curved fin linkage part 23 is on the reference line AX. A plurality of fin linkage parts 23 are arranged at predetermined intervals (pitch P; see FIG. 3) from each other in a longitudinal direction. Note that the shape of the fin linkage part 23 is not limited to a shape that projects curvedly downward in a longitudinal direction, and may instead be a V-shape which opens toward the upper part thereof in a longitudinal direction (i.e., a V-shape), however, as a flow path, it is preferable that the fin linkage part 23 have a shape that projects curvedly downward in a longitudinal direction.

In the heat sink 200 described above, the pitch P of the heat-dissipating fins 2 (see, FIG. 3), the first angle $\theta1$ (see, FIG. 3), the second angle $\theta2$ (see, FIG. 3), and the height H of heat-dissipating fins 2 (see, FIG. 2) can be obtained, for example, as follows using thermal analysis software. First, the vertical and horizontal lengths (see, reference symbols L1 and L2 in FIG. 3) of the base 1 are determined. Next, the pitch P, the first angle $\theta1$, the second angle $\theta2$, and the height H of the heat-dissipating fins 2 are adjusted, and the performance of the heat sink after the adjustment (the heat dissipation efficiency, etc.) is confirmed for each adjustment. As a result, the pitch P, the first angle $\theta1$, the second angle $\theta2$, and the height H of the heat-dissipating fins 2 at which the best performance (the heat dissipation efficiency, etc.) is exhibited can be obtained.

Next, the operation of the heat sink 200 according to the second example embodiment will be described with reference to FIGS. 4, 5, and 6.

Figure 4:
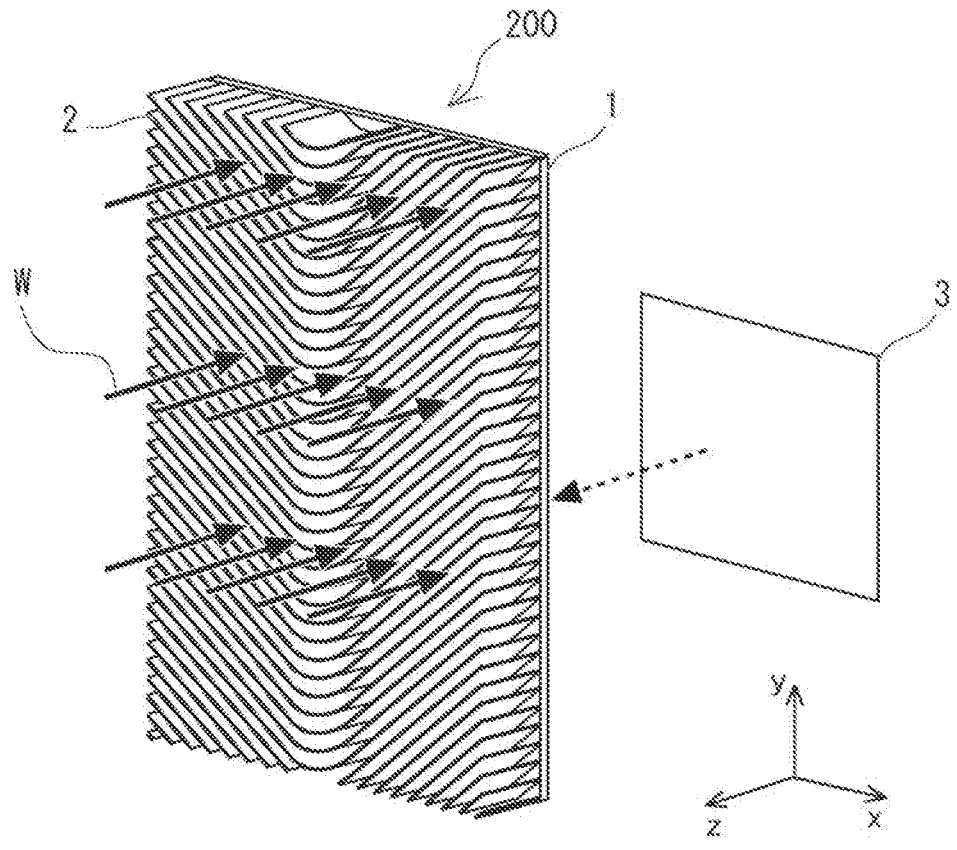
FIG. 4 is a diagram showing a relationship between the heat sink according to the second example embodiment and an object to be cooled.

FIG. 4 is a diagram showing a relationship between the heat sink 200 and an object to be cooled 3. As shown in FIG. 4, the heat sink 200 dissipates heat transferred from the object to be cooled 3 into air. Specifically, the heat sink 200 is attached to the object to be cooled 3 (the heat source) while the object to be cooled 3 is in contact with other surface of the base 1 opposite to the one surface on which the plurality of heat-dissipating fins 2 are provided. Then, the heat sink 200 cools the object to be cooled 3 by using air W in the atmosphere (natural breeze; indicated by the solid arrows) which flows between the plurality of heat-dissipating fins 2 of the base 1 in the heat sink 200. Although the air W flows in the direction perpendicular to the surface of the base 1 in FIG. 4, the direction in which the air W flows is not limited to the perpendicular direction.

Figure 5:
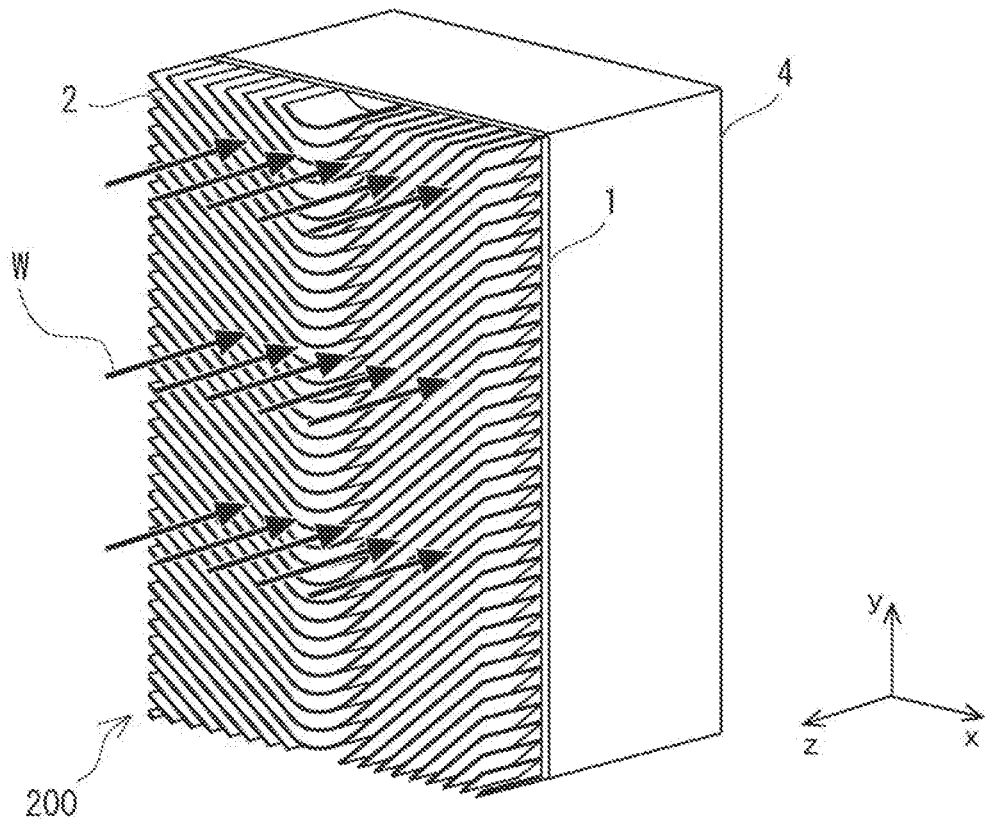
FIG. 5 is a diagram showing an example of installation of the heat sink according to the second example embodiment in an apparatus that is an object to be cooled.

FIG. 5 is a diagram showing an example of installation of the heat sink 200 in an apparatus that is the object to be cooled 3. As shown in FIG. 5, a cabinet 4, for example, constitutes a radio base station of a mobile phone (for example, an antenna integrated outdoor base station for 5G) (i.e., generates heat due to operation of a radio base station), and is an object to be cooled 3. When installed in the cabinet 4, the heat sink 200 (the heat-dissipating fins 2) dissipates heat transferred from the cabinet 4 through the base 1 (the other surface) into the air. At this time, the heat sink 200 is attached to the cabinet 4 of the object to be cooled in a state in which one of the six faces of the cabinet 4 is in contact with the other surface of the base 1 opposite to the one surface on which the plurality of heat-dissipating fins 2 are provided. It should be noted that the heat sink 200 may be attached to a plurality of faces of the cabinet 4 among the six faces thereof. The number of faces of the cabinet 4 is not limited to six.

Figure 6:
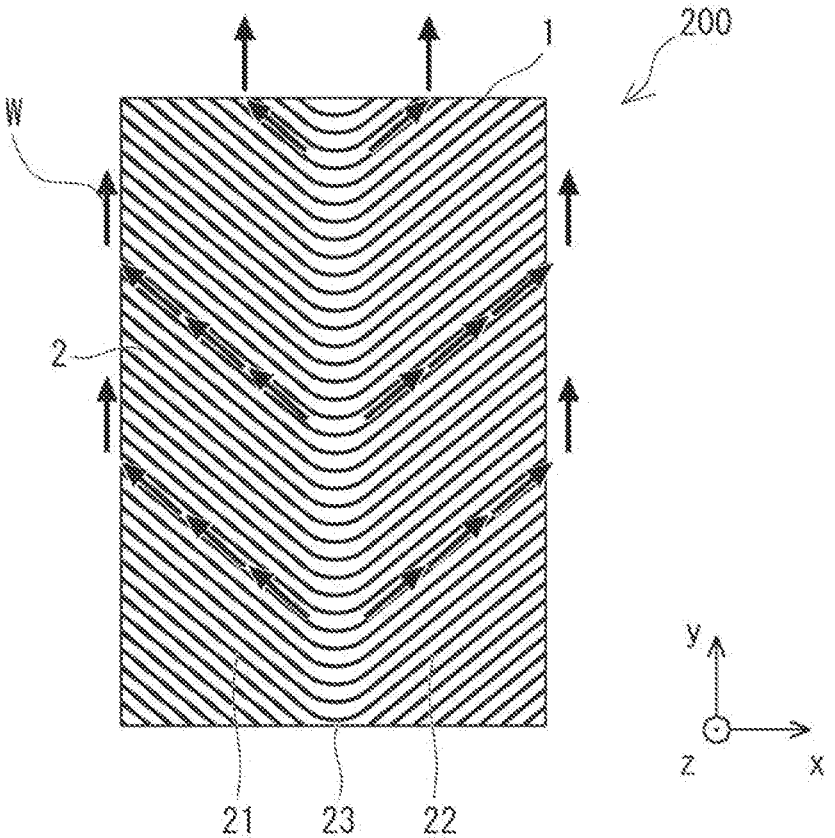
FIG. 6 is a diagram showing a flow path of air flowing into the heat sink according to the second example embodiment.

FIG. 6 shows a flow path of air W flowing into the heat sink 200. As shown in FIG. 6, air W (natural breeze; indicated by solid arrows) flows into the heat sink 200. After the air W hits the base 1 of the heat sink 200, the air W is discharged from the inside of the base 1 to the outside thereof through the plurality of heat-dissipating fins 2. Specifically, the air W flowing into the left oblique fin part 21 is discharged from the inside of the base 1 to the outside thereof through the left oblique fin part 21. On the other hand, the air W flowing into the right oblique fin part 22 is discharged from the inside to the outside of the base 1 through the right oblique fin part 22. As a result, the heat sink 200 dissipates the heat of the object to be cooled 3 using the air passing between the left oblique fin part 21 or the right oblique fin part 22.

Figure 7:
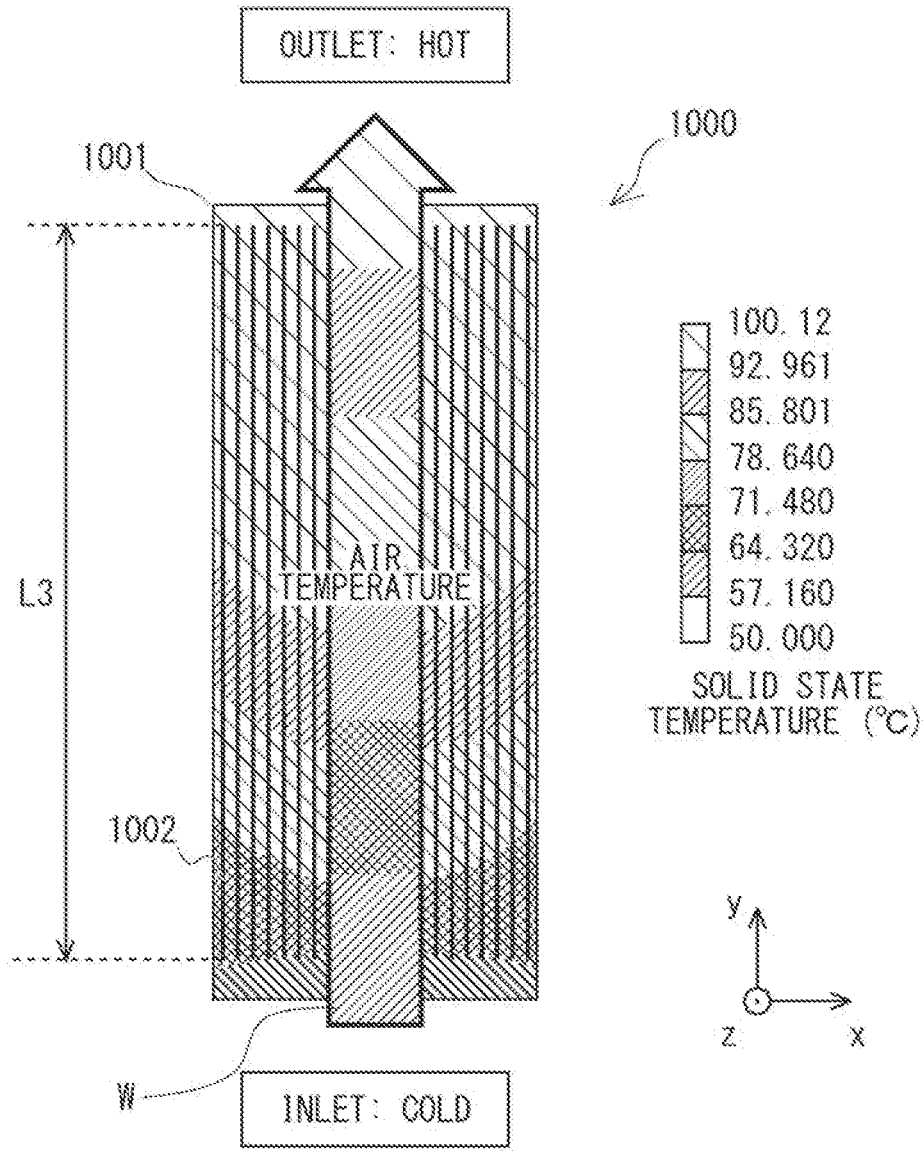
FIG. 7 is a view showing a temperature change of air flowing into a heat sink according to a comparative example.
Figure 8:
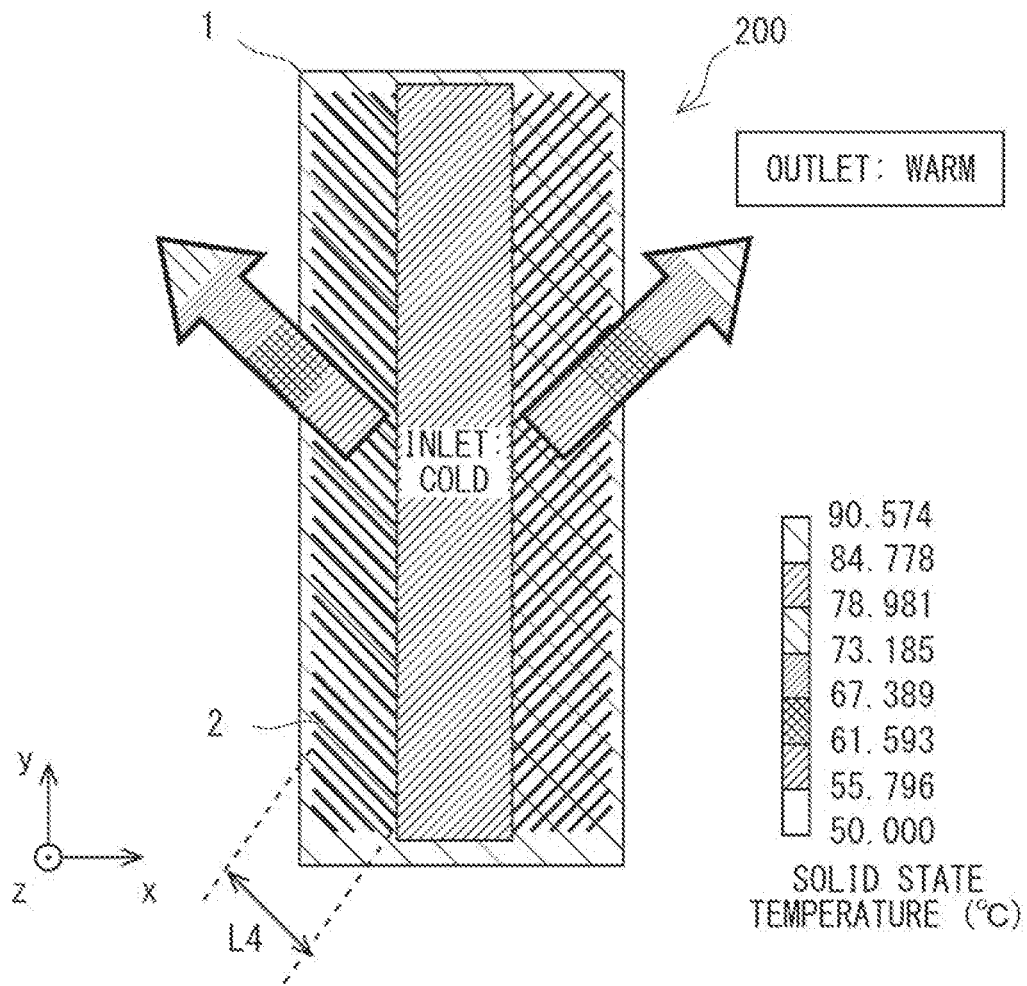
FIG. 8 is a diagram showing a temperature change of air flowing into the heat sink according to the second example embodiment.

Next, an effect of the heat sink 200 according to the second example embodiment will be described with reference to FIGS. 7 and 8. FIG. 7 is a diagram showing a temperature change of air flowing into a heat sink 1000 according to a comparative example. On the other hand, FIG. 8 is a diagram showing a temperature change of air in the heat sink 200 according to the second example embodiment. In FIGS. 7 and 8, the temperature of air in terms of solid state temperature (° C.) is shown by hatched lines.

As shown in FIG. 7, on one surface of a base 1001 of the heat sink 1000 according to the comparative example, a plurality of heat-dissipating fins 1002 are provided so as to form a flat matrix in the lateral direction (x-direction) of the base 1001. For example, the heat sink 1000 is installed in the object to be cooled 3 (not shown) so that the surface of the base 1001 on the downward longitudinal direction side (downward side in the y-direction) is on the ground side. In the heat sink 1000 employing natural air cooling, it is widely known that the length of the heat-dissipating fins 1002 has an optimum value rather than being long. In recent years, since base stations for mobile devices and the like have built-in antennas, apparatuses tend to be long lengthwise depending on the substrate size thereof. Accordingly, a length L3 of each heat-dissipating fin 1002 tends to be long lengthwise. Accordingly, the distance which the cold air W entering the heat sink 1000 from an inlet flows between the heat-dissipating fins 1002 increases when the cold air W flows between the heat-dissipating fins 1002, causing the cold air W to be gradually warmed and hot air stagnates in the upper part of the heat sink 1000. As a result, heat dissipation efficiency in the heat sink 1000 becomes poor.

On the other hand, as shown in FIG. 8, in the heat sink 200 according to the second example embodiment, the heat-dissipating fins 2 are inclined at angles θ1 and θ2 with respect to the reference line AX. As a result, the length L4 (see, FIG. 8) of each heat-dissipating fin 2 of the heat sink 200 is shorter than the length L3 (see, FIG. 7) of each heat-dissipating fin 1002 of the heat sink 1000. Accordingly, in the heat sink 200, since the distance which the cold air W entering the heat sink 200 from an inlet flows between the heat-dissipating fins 2 is shorter than the distance which the cold air W entering the heat sink 1000 from the inlet flows between the heat-dissipating fins 1002, the air W is discharged to the outside before being warmed between the heat-dissipating fins 2 (the left oblique fin part 21 and the right oblique fin part 22). Heat dissipation efficiency of the heat sink 200 is improved compared with that of the heat sink 1000. That is, efficient natural air cooling is possible. Further, since heat dissipation efficiency of the heat sink 200 is improved compared with that of the heat sink 1000, downsizing and weight reduction of the heat sink can be realized.

In addition, the heat sink 200 has high manufacturability. For example, when the heat sink 200 is manufactured by casting, the manufacturability thereof is high. This is because an end of the left oblique fin part 21 is linked (connected) to an end of the right oblique fin part 22, the ends being opposed to each other, by the fin linkage part 23, so that the running process (especially the running process of the heat-dissipating fin 2) when the heat sink 200 is manufactured by casting is better than that when the left oblique fin part and the right oblique fin part are not linked (see, aforementioned Patent Literature 1). Further, when the heat sink is manufactured by skiving aluminum or a copper-based metal material, the center of the heat sink 200 does not need to be cut in order to form a space between the left oblique fin part and the right oblique fin part as described in the aforementioned Patent Literature 1, thereby reducing the manufacturing cost such as the machining cost required for the cutting.

Modified Example of Second Example Embodiment

Next, a configuration of a heat sink 200A according to a modified example of the second example embodiment will be described with reference to FIGS. 9 and 10.

Figure 9:
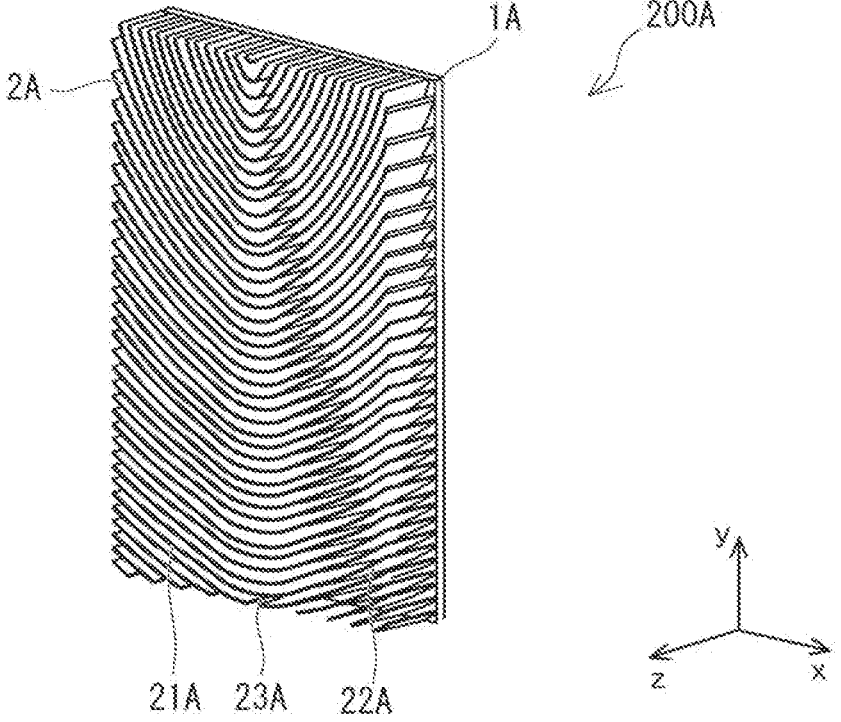
FIG. 9 is a side view showing an example of a configuration of a heat sink according to a modified example of the second example embodiment.

FIG. 9 is a perspective view showing an example of a configuration of the heat sink 200A. FIG. 10 is a front view showing an example of a configuration of the heat sink 200A.

In the second example embodiment, an example in which the left oblique fin part 21 and the right oblique fin part 22 (see FIG. 3, etc.) extend linearly along one surface has been described, but it is not limited thereto.

Figure 10:
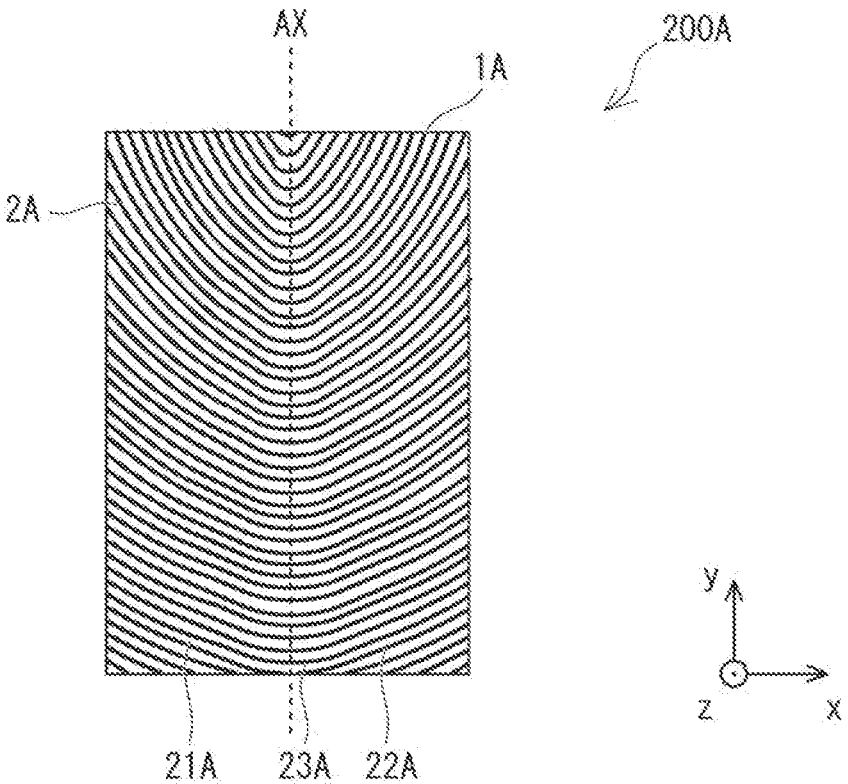
FIG. 10 is a front view showing an example of a configuration of the heat sink according to the modified example of the second example embodiment.

For example, taking the designability into consideration, as shown in FIGS. 9 and 10, at least one of the left oblique fin part 21 and the right oblique fin part 22 may extend curvilinearly along one surface.

Third Example Embodiment

Next, a configuration of a heat sink 300 according to a third example embodiment will be described with reference to FIG. 11.

When the heat sink 200 according to the second example embodiment is installed in an outdoor environment, water may accumulate in the fin linkage part 23 due to the influence of rain and snow. In order to suppress such accumulation of water, as shown in FIG. 11, in the heat sink 300 according to the third example embodiment, a notched part (a groove) 231 that penetrates in the longitudinal direction (y-direction) serving as a drain outlet is provided to the fin linkage part 23 (for example, the bottom part of the fin linkage part 23) of the heat-dissipating fin 2 of the heat sink 200 according to the second example embodiment. The notched part 231 is provided with the root part of the fin linkage part 23 (the part near a base 1A of the fin linkage part 23) left as it is. The notched part 231 is not limited to being provided with the root part of the fin linkage part 23 left as it is, and may be provided so as to penetrate in the longitudinal direction with a part of the fin linkage part 23 left as it is. The notched part 231 may not necessarily be provided with the root part of the fin linkage part 23 left as it is.

Figure 11:
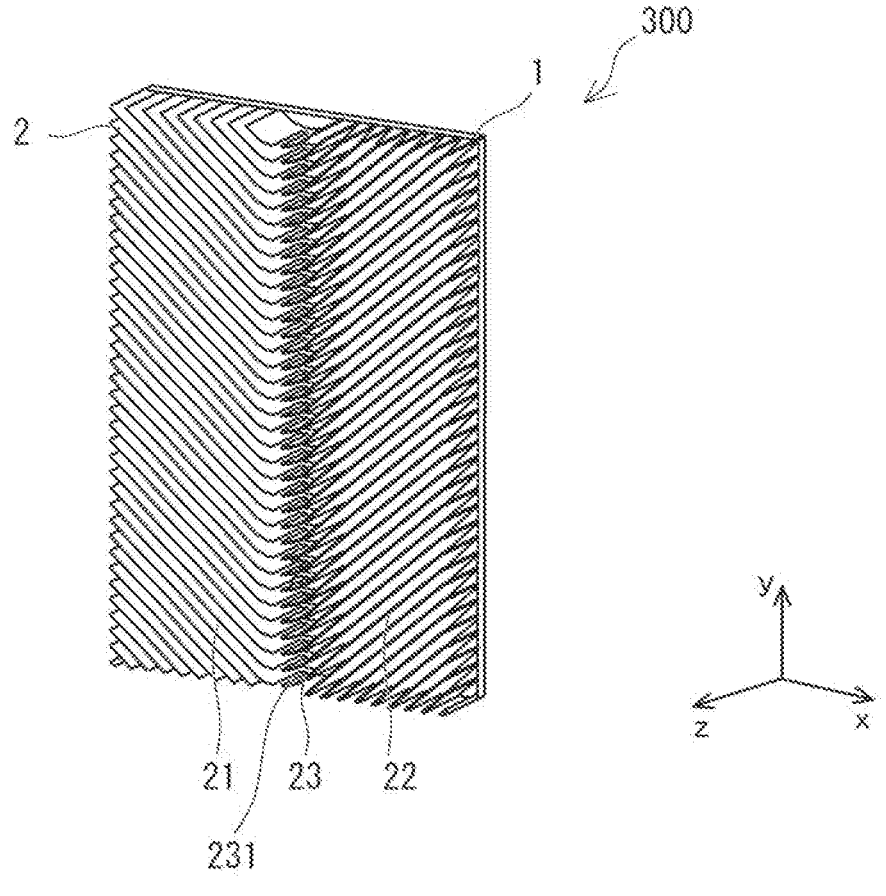
FIG. 11 is a side view showing an example of a configuration of a heat sink according to a third example embodiment.

When the heat sink 300 is attached to the object to be cooled 3 in the direction shown in FIG. 11, water flows between the left oblique fin part 21 and the right oblique fin part 22 to reach the fin linkage part 23 (for example, the bottom of the fin linkage part 23). After reaching the fin linkage part 23, water is drained through the notched part 231 provided in the fin linkage part 23. Therefore, it is possible to suppress accumulation of water in the heat-dissipating fins 2 (mainly, in the fin linkage part 23).

Further, in the heat sink 300, since the notched part 231 is provided in a state in which a part (e.g., a root part) of the fin linkage part 23 is left as it is, the ease of the running process when the heat sink 300 (the base 1 and the heat-dissipating fins 2) is manufactured by casting can be compatible with the function of suppressing accumulation of water in the heat-dissipating fins 2.

Note that the present disclosure is not limited to the above example embodiments, and can be suitably changed to the extent that it does not deviate from the gist of the present disclosure. For example, in each of the above example embodiments, an example in which the heat sink of the present disclosure is applied to natural air cooling has been described, but the heat sink of the present disclosure may also be applied to forced air cooling. For example, the heat sink of the present disclosure may be used for indoor equipment equipped with a fan (electric fan) for forced air cooling.

In addition, the shape of the base 1 of the heat sink 200 is not limited to a board-like shape as long as the base 1 has a surface on which the plurality of heat-dissipating fins 2 are provided at intervals. The shape of the base 1 may be, for example, a triangular prism or a square prism.

Further, the surface of the base 1 of the heat sink 200 in contact with the object to be cooled 3 may be a curved surface or a surface formed of a flat surface and a curved surface. In the heat sink 200, the object to be cooled 3 may be prevented from being in contact with the base 1.

Although the present invention has been described with reference to the example embodiments, the present disclosure is not limited by the foregoing. Various changes in the configuration and details of the present disclosure can be made within the scope of the disclosure that can be understood by a person skilled in the art.

This application claims priority based on Japanese Patent Application 2021-146390 filed on Sep. 8, 2021 and all of its disclosures are incorporated herein.

REFERENCE SIGNS LIST

1, 1A BASE
2, 2A HEAT-DISSIPATING FIN
3 OBJECT TO BE COOLED
4 CABINET
21, 21A FIRST OBLIQUE FIN PART
22, 22A SECOND OBLIQUE FIN PART
23, 23A FIN LINKAGE PART
231 NOTCHED PART
100, 200, 200A, 300 HEAT SINK
1000 HEAT SINK
1001 BASE
1002 HEAT-DISSIPATING FIN

What is claimed is:

1. A heat sink comprising a base having a surface on which a plurality of heat-dissipating fins are provided at intervals, wherein each of the plurality of heat-dissipating fins includes:

a first oblique fin part inclined to one side of the surface at a first angle with respect to a reference line extending in a longitudinal direction of the surface;

a second oblique fin part inclined to other side of the surface at a second angle with respect to the reference line; and a fin linkage part for linking an end of the first oblique fin to an end of the second oblique fin part, which are opposed to each other, wherein the fin linkage part is provided with a notched part penetrating in a longitudinal direction with a root portion of the fin linkage part left.

2. The heat sink according to claim 1, wherein both the first angle and the second angle are acute angles.

3. The heat sink according to claim 2, wherein the first angle is the same as the second angle are the same angle.

4. The heat sink according to claim 2 wherein the reference line passes through the center of the base with respect to a lateral direction and extends in a longitudinal direction.

5. The heat sink according to claim 2, wherein the fin linkage part projects curvedly downward in a longitudinal direction.

6. The heat sink according to claim 1, wherein at least one of the first oblique fin part and the second oblique fin part extends linearly.

7. The heat sink according to claim 1, wherein at least one of the first oblique fin part and the second oblique fin part extends curvilinearly.

8. The heat sink according to claim 1, wherein the base further has a surface that is in contact with an object to be cooled, and the plurality of heat-dissipating fins dissipate heat transferred from the object to be cooled through a surface in contact with the object to be cooled.

9. The heat sink according to claim 1, wherein the base and the plurality of heat-dissipating fins form an integral component manufactured by casting.

* * * * *